(12) United States Patent
Kawano

(10) Patent No.: US 12,101,004 B2
(45) Date of Patent: Sep. 24, 2024

(54) ELECTRIC ROTATING MACHINE APPARATUS AND ELECTRIC POWER STEERING APPARATUS

(71) Applicant: Mitsubishi Electric Corporation, Tokyo (JP)

(72) Inventor: Yu Kawano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/766,676

(22) PCT Filed: Nov. 18, 2019

(86) PCT No.: PCT/JP2019/045037
§ 371 (c)(1),
(2) Date: Apr. 5, 2022

(87) PCT Pub. No.: WO2021/100075
PCT Pub. Date: May 27, 2021

(65) Prior Publication Data
US 2024/0072614 A1    Feb. 29, 2024

(51) Int. Cl.
*H02K 11/40* (2016.01)
*H02K 11/00* (2016.01)
(Continued)

(52) U.S. Cl.
CPC ......... *H02K 11/40* (2016.01); *H02K 11/0094* (2013.01); *H02K 11/21* (2016.01);
(Continued)

(58) Field of Classification Search
CPC .... H02K 11/0094; H02K 11/21; H02K 11/25; H02K 11/40; H02K 2211/03;
(Continued)

(56) References Cited

U.S. PATENT DOCUMENTS

2011/0254388 A1* 10/2011 Yamasaki ............ H02K 9/227
310/43
2013/0257328 A1* 10/2013 Arai ...................... H02P 29/032
318/400.22
(Continued)

FOREIGN PATENT DOCUMENTS

EP    3 447 887 A1    2/2019
JP    10-135588 A    5/1998
(Continued)

OTHER PUBLICATIONS

Ichikawa et al, Electric Power Steering Device, Apr. 18, 2019, WO 2019073594 (English Machine Translation) (Year: 2019).*
(Continued)

*Primary Examiner* — Alexander A Singh
(74) *Attorney, Agent, or Firm* — Sughrue Mion, PLLC; Richard C. Turner

(57) ABSTRACT

The objective of the present disclosure is to obtain an electric rotating machine apparatus the heat-radiation performance of control circuit boards are secured, and communication between the control circuits and connection thereof with the sensor are realized with a small size and at a low price. A first terminal group and a second terminal group connect

- a first control circuit board on which a first control circuit for controlling a current in the winding of a first system is mounted,
- a second control circuit board that faces the first control circuit board with respect to the axis line of an output axle and on which a second control circuit for controlling a current in the winding of a second system is mounted, and (Continued)

a sensor circuit board that faces the axle end of the output axle and on which the sensor and a communication line are mounted.

12 Claims, 14 Drawing Sheets

(51) Int. Cl.
*H02K 11/21* (2016.01)
*H02K 11/25* (2016.01)
*B62D 5/04* (2006.01)

(52) U.S. Cl.
CPC ............ *H02K 11/25* (2016.01); *B62D 5/0403* (2013.01); *H02K 2211/03* (2013.01)

(58) Field of Classification Search
CPC ...... H02K 11/215; H02K 11/30; H02K 11/33; H02K 5/225; H02K 11/02; B62D 5/0403
USPC ........................................ 310/68 R, 68 B, 71
See application file for complete search history.

(56) References Cited

U.S. PATENT DOCUMENTS

| | | | |
|---|---|---|---|
| 2015/0108992 A1 | 4/2015 | Kouda et al. | |
| 2017/0294860 A1 | 10/2017 | Yamasaki | |
| 2018/0062556 A1 | 3/2018 | Yue | |
| 2018/0178739 A1 | 6/2018 | Fujimoto et al. | |
| 2018/0178829 A1 | 6/2018 | Fujimoto | |
| 2019/0068030 A1 | 2/2019 | Sato | |
| 2019/0140574 A1 | 5/2019 | Yamasaki | |
| 2019/0260324 A1* | 8/2019 | Kuramitsu | ........... B62D 5/0484 |
| 2020/0239065 A1 | 7/2020 | Fujimoto | |
| 2021/0362771 A1 | 11/2021 | Ichikawa et al. | |
| 2021/0371006 A1 | 12/2021 | Ichikawa et al. | |

FOREIGN PATENT DOCUMENTS

| | | | | |
|---|---|---|---|---|
| JP | 2012-210031 A | 10/2012 | | |
| JP | 2015-079649 A | 4/2015 | | |
| JP | 2016-171664 A | 9/2016 | | |
| JP | 2017-159768 A | 9/2017 | | |
| JP | 2017-159771 A | 9/2017 | | |
| JP | 2017-189034 A | 10/2017 | | |
| JP | 2018-130007 A | 8/2018 | | |
| JP | 2018-207641 A | 12/2018 | | |
| WO | 2019/064423 A1 | 4/2019 | | |
| WO | WO-2019073594 A1 * | 4/2019 | ........... B62D 5/0406 | |

OTHER PUBLICATIONS

Office Action issued Sep. 20, 2022 in Japanese Application No. 2021-558038.
Extended European Search Report dated Oct. 25, 2022, issued in European Application No. 19953252.4.
International Search Report of PCT/JP2019/045037 dated Jan. 28, 2020 [PCT/ISA/210].
Notification of Reasons for Refusal dated Mar. 14, 2023 from the Japanese Patent Office in application No. 2021-558038.
Chinese Office Action dated Jul. 13, 2024 in Application No. 201980102216.X.

* cited by examiner

ELECTRIC ROTATING MACHINE APPARATUS AND ELECTRIC POWER STEERING APPARATUS

CROSS REFERENCE TO RELATED APPLICATIONS

This application is a National Stage of International Application No. PCT/JP2019/045037, filed Nov. 18, 2019.

TECHNICAL FIELD

The present disclosure relates to an electric rotating machine apparatus and an electric power steering apparatus.

BACKGROUND ART

As an electric rotating machine apparatus, there is known an electric rotating machine apparatus in which windings of two systems are provided in an electric rotating machine and in which there are provided two control circuits for separately controlling respective currents flowing in the windings of the two systems. Because the two systems can separately be controlled, redundancy can be achieved (for example, disclosed in Patent Document 1).

CITATION LIST

Patent Literature

Patent Document 1: Japanese Patent Application Laid-Open No. 2016-171664
Patent Document 2: Japanese Patent Application Laid-Open No. 2017-189034
Patent Document 3: Japanese Patent Application Laid-Open No. 2017-159768

In the technology disclosed in Patent Document 1, respective control circuits of two systems provided for driving windings of two systems are arranged on one side and the other side, respectively, of a single control circuit board. Each of the two control circuits has a microcomputer. A communication line is provided between the two microcomputers; the communication line is utilized for transmitting mutual abnormality information items, performing mutual monitoring, and the like. The communication line is formed of an inter-layer conduction path that penetrates the control circuit board.

However, in the case where respective control circuits for controlling windings of different systems are provided on one and the other sides, respectively, of a control circuit board, there exists a probability that physical damage to the control circuit board causes concurrent malfunctions in both of the control circuits of the two systems. Moreover, there exists a high probability that a heat source in a driving circuit concentrates in a single control circuit board and hence temperature rising in the driving circuit intensifies.

In the technology disclosed in Patent Document 2, two control circuit boards on which respective control circuits of two systems provided for driving windings of two systems are arranged in parallel with each other in such a way as to be spaced a predetermined distance apart from each other. A rotation sensor is disposed on one of the control circuit boards. The two control circuit boards, which are provided in parallel with each other, are connected with each other by means of relatively long terminals and spring terminals; through the relatively long terminals, inter-board signals and sensor signals are transmitted therebetween.

Because provided in such a way as to be spaced apart from each other, the control circuits of two systems are physically separated from each other; thus, the independence of each system is high and the failure resistance is also high. In addition, because a physical distance is secured, there exists an advantage also in the heat-radiation performance. However, because the two control circuit boards are connected with each other by means of relatively long terminals and spring terminals for absorbing misalignment and distortion of the terminal, the cost of the connection portion rises and the volume of the terminal portion increases.

In the technology disclosed in Patent Document 3, control circuits of two systems provided for driving windings of two systems are mounted on two respective control circuit boards. A rotation sensor is disposed on a rotation-position detection circuit board. However, neither a means for transmitting signals between the two control circuit boards nor a means for transmitting a signal of the rotation sensor to the control circuit boards is referred to.

SUMMARY OF INVENTION

In recent years, the important issues of an electric power steering apparatus are downsizing of the mounting space and reduction of the cost; therefore, with regard to an electric rotating machine apparatus to be applied to an electric power steering apparatus, the downsizing and the cost reduction are further required.

Accordingly, the objective of the present disclosure is to obtain an electric rotating machine apparatus and an electric power steering apparatus in which in order to drive an electric rotating machine having windings of two systems, a sensor and control circuits of the two systems are provided and in which while the independence of each of the systems and the heat-radiation performance of a control circuit board are secured, communication between the control circuits of the two systems and connection thereof with the sensor are realized with a small size and at a low price.

Solution to Problem

An electric rotating machine apparatus according to the present disclosure includes
 an electric rotating machine having a winding of a first system, a winding of a second system, and an output axle,
 one or more sensors for detecting an operating state of the electric rotating machine,
 a first control circuit board on which a first control circuit for controlling a current in the winding of the first system is mounted,
 a second control circuit board that faces the first control circuit board with respect to an axis line of the output axle and on which a second control circuit for controlling a current in the winding of the second system is mounted,
 a communication line connecting the first control circuit with the second control circuit,
 a sensor circuit board that faces an axle end of the output axle and on which the one or more sensors and the communication line are mounted,
 a first terminal group that electrically connects the first control circuit board with the sensor circuit board, and
 a second terminal group that electrically connects the second control circuit board with the sensor circuit board.

An electric power steering apparatus according to the present disclosure includes the foregoing electric rotating machine apparatus.

Advantage of Invention

In an electric rotating machine apparatus and an electric power steering apparatus according to the present disclosure, in order to drive an electric rotating machine having windings of two systems, control circuits of the two systems, a communication line for connecting the control circuits, and a sensor are provided; a first control circuit board on which a first control circuit for controlling a current in the winding of a first system is mounted and a second control circuit board on which a second control circuit for controlling a current in the winding of a second system is mounted are arranged in such a way as to face each other with respect to an output axle; a sensor circuit board on which the sensor and the communication line are mounted is disposed in such a way as to face the axle end of the output axle and to be perpendicular to the output axle; a first terminal group electrically connects the first control circuit board with the sensor circuit board, and a second terminal group electrically connects the second control circuit board with the sensor circuit board. As a result, it is made possible that while the independence and the heat-radiation performance of each of the control circuit boards are secured, mutual communication between the control circuits of the two systems and connection thereof with the sensor are realized with a small size and at a low price.

DESCRIPTION OF EMBODIMENTS

1. Embodiment 1

Figure 1:
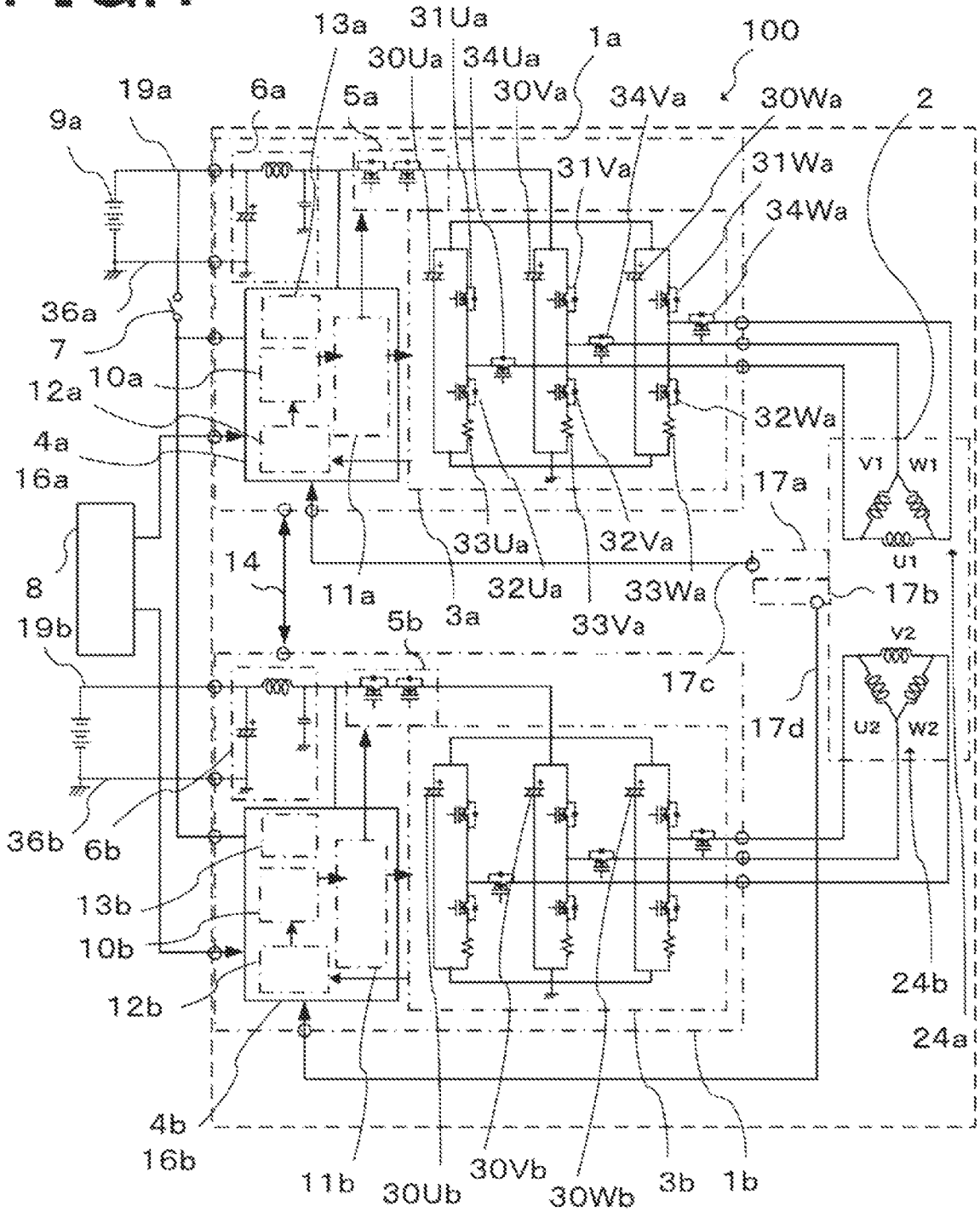
FIG. 1 is a circuit diagram of an electric rotating machine apparatus according to Embodiment 1.
Figure 2:
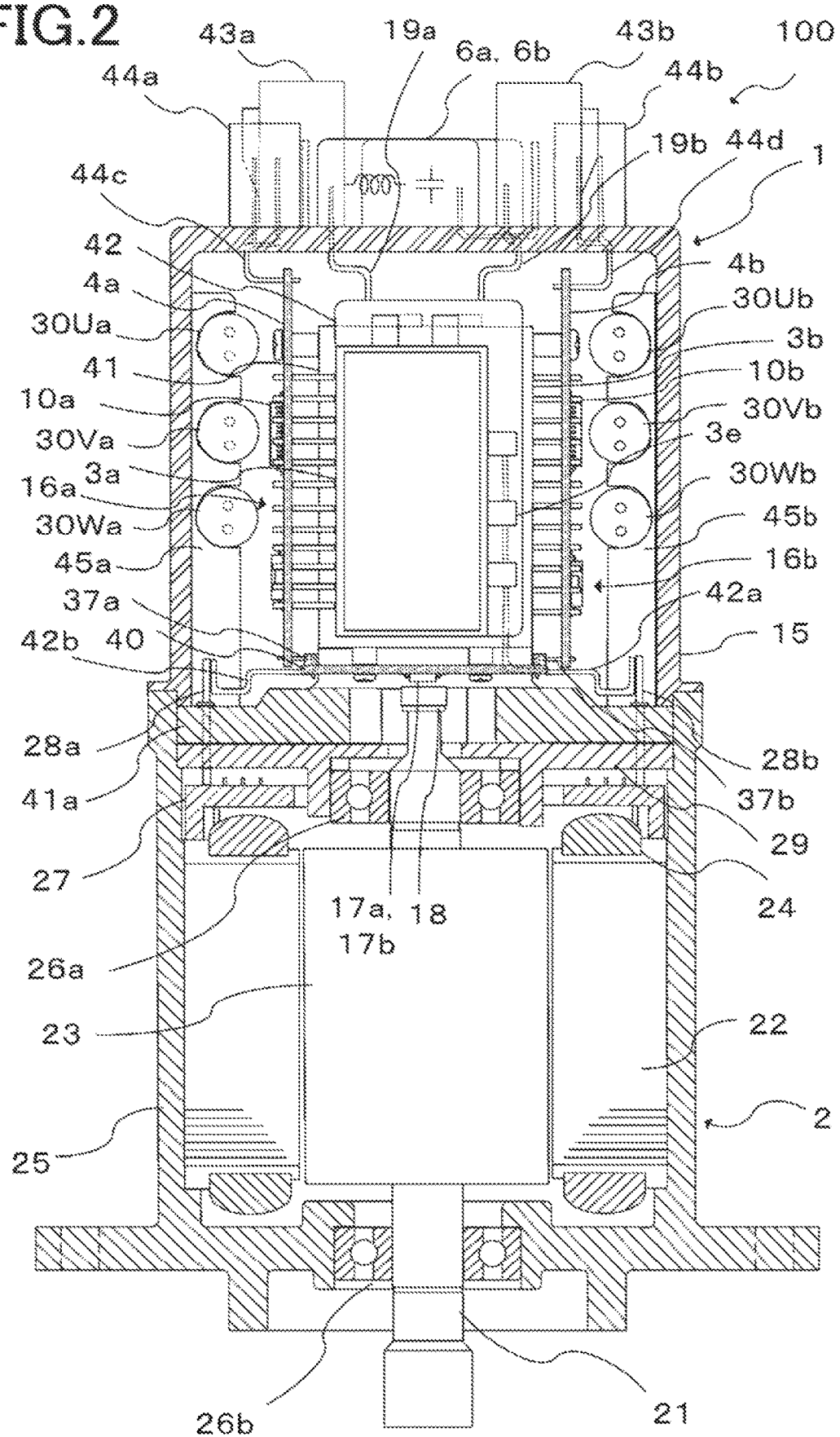
FIG. 2 is a cross-sectional view of the electric rotating machine apparatus according to Embodiment 1.
Figure 3:
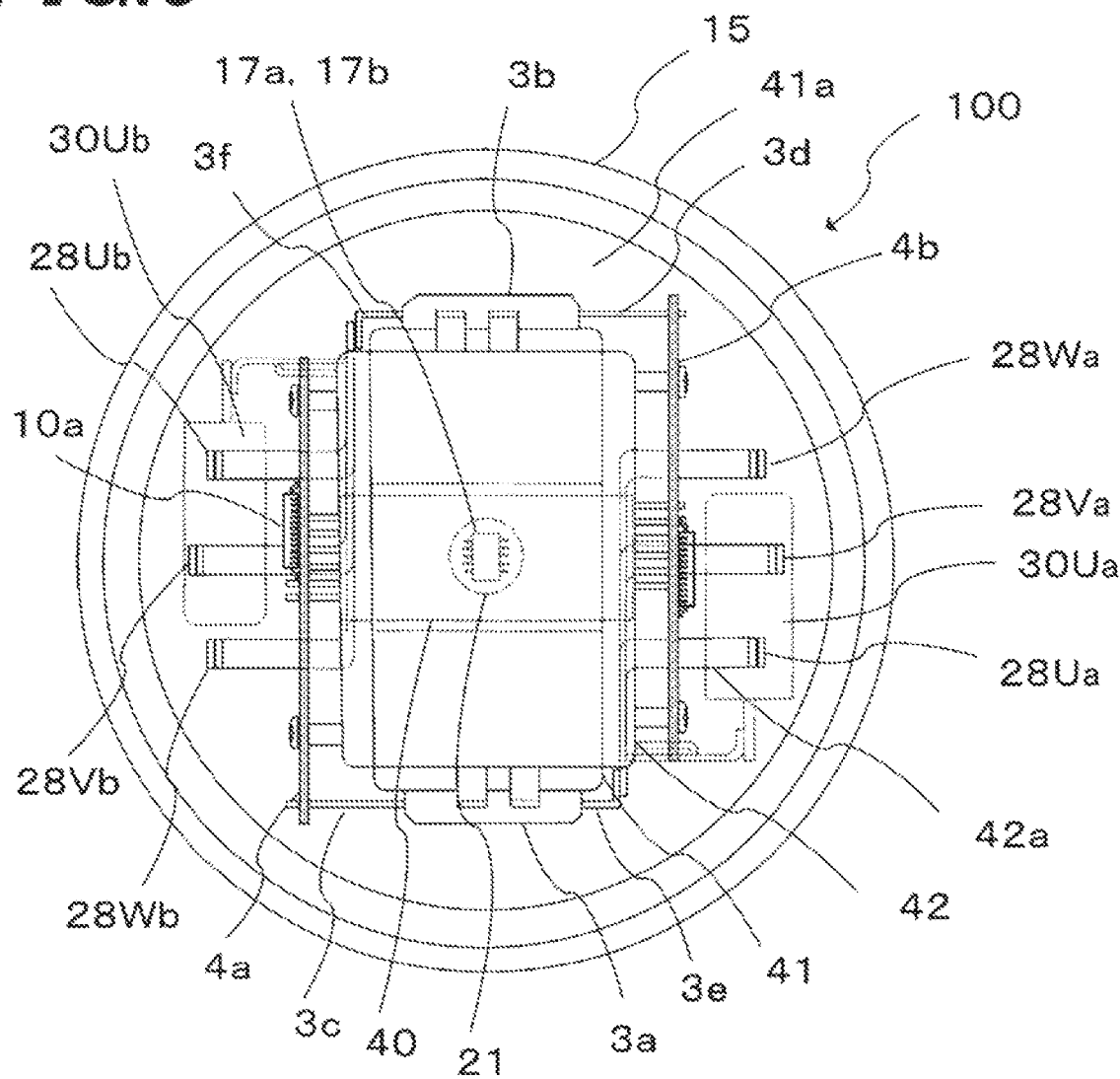
FIG. 3 is a perspective view of the electric rotating machine apparatus according to Embodiment 1, when viewed from the top side.

Hereinafter, an electric rotating machine apparatus 100 according to Embodiment 1 will be explained with reference to the drawings. FIG. 1 is a circuit diagram of the electric rotating machine apparatus 100 according to Embodiment 1. FIG. 2 is a cross-sectional view of the electric rotating machine apparatus 100 according to Embodiment 1. FIG. 3 is a perspective view of the electric rotating machine apparatus 100 according to Embodiment 1, when viewed from the top side.

<Control Unit>

The circuit diagram in FIG. 1 represents an example in which the electric rotating machine apparatus 100 is applied to an electric power steering apparatus. The electric rotating machine apparatus 100 has a first control unit 1a, a second control unit 1b, and an electric rotating machine 2 including windings 24a and 24b of two three-phase systems. The first control unit 1a and the second control unit 1b has one and the same configuration, and substantially the same components are mounted in each thereof. Hereinafter, only the first control unit 1a will be explained, because the same explanation can be applied also to the second control unit 1b.

The first control unit 1a includes a first control circuit 16a having a first CPU 10a, a first power module 3a for supplying a current to the electric rotating machine 2, a first power-source-relay switching device 5a, and a first filter 6a. From a first battery 9a mounted in a vehicle, a first power-source input 19a and a first ground 36a are connected with the first control unit 1a, and information of turning on an ignition switch 7 is inputted to the first control unit 1a. Moreover, from a sensor group 8, information items from a torque sensor, which is mounted in the vicinity of the handwheel and detects steering torque, a speed sensor, which detects the traveling speed of the vehicle, and the like are inputted to the first control unit 1a.

<Control Circuit>

The first battery 9a supplies electric power to the first control circuit 16a by way of the first filter 6a; a first power-source output is generated by a first power-source circuit 13a and is supplied to the inside of the first control circuit 16a. The information items from the sensor group 8 are transmitted to the first CPU 10a by way of a first input circuit 12a of the first control circuit 16a. Based on those information items, the first CPU 10a calculates and outputs a current value for rotating the electric rotating machine 2. The output signal of the first CPU 10a is transmitted to the first power module 3a by way of a first driving circuit 11a included in an output circuit. When receiving a command signal from the first CPU 10a, the first driving circuit 11a outputs driving signals for driving switching devices in the first power module 3a. The components of the first control circuit 16a are mounted on a first control circuit board 4a.

The first driving circuit 11a is mounted to the first control circuit 16a, because only small current flows therein; however, it can be disposed in the first power module 3a. In addition, it may be allowed that the first control circuit 16a contains the first power module 3a and the components of the first power module 3a are mounted on the first control circuit board 4a.

<Power Module>

The first power module 3a mainly includes

U1-phase upper-arm and lower-arm switching devices 31Ua and 32Ua for a U1 phase of a first-three-phase winding 24a of the electric rotating machine 2, V1-phase upper-arm and lower-arm switching devices 31Va and 32Va for a V1 phase of the first-three-phase winding 24a of the electric rotating machine 2, and W1-phase upper-arm and lower-arm switching devices 31Wa and 32Wa for a W1 phase of the first-three-phase winding 24a of the electric rotating machine 2, electric-rotating-machine relay switching devices 34Ua, 34Va, and 34Wa for connecting or disconnecting wiring with the winding 24a of the first system of the electric rotating machine 2, current-detection shunt resistors 33Ua, 33Va, and 33Wa, and noise-suppression capacitors 30Ua, 30Va, and 30Wa.

Because the same circuit configuration is provided for the windings 24a of the respective phases, the windings 24a of the respective phases can independently be supplied with currents.

Although in FIG. 1, the description is omitted, the respective electric-potential differences across the shunt resistors 33Ua, 33Va, and 33Wa and, for example, the respective voltages of the motor winding terminals are also transmitted to the first input circuit 12a. These information items are also inputted to the first CPU 10a; the first CPU 10a calculates the difference between the calculated current value and a detection value and then performs so-called feedback control so as to supply a desired motor current and to assist steering power.

Moreover, the first control circuit 16a also outputs a driving signal for the first power-source-relay switching device 5a that supplies the first power-source input 19a to the first power module 3a by way of the first filter 6a. The first power-source-relay switching device 5a can cut off current supply to the electric rotating machine 2.

The electric-rotating-machine relay switching devices 34Ua, 34Va, and 34Wa are also provided in the first power module 3a and can cut off the respective phases. In order to suppress emission of noise caused by PWM driving in the first power module 3a, the filter 6a including a capacitor and a coil is disposed close to the first power-source input 19a. In addition, it is also made possible that as the countermeasure for the fact that a large current flows and hence heat is generated in the first power-source-relay switching device 5a, there is formed a power module in which the first power module 3a contains the first power-source-relay switching device 5a. Heretofore, the first control unit 1a has been explained; because the same explanation can be applied to the second control unit 1b, there will be omitted the explanations for a second control circuit board 4b, a second CPU 10b, a second input circuit 12b, a second power-source circuit 13b, and a second driving circuit 11b that are included in a second control circuit 16b, a second power-source-relay switching device 5b, a second filter 6b, and a second power module 3b.

<Communication Line>

The first CPU 10a has an abnormality detection function of detecting an abnormality in any one of the sensor group 8, the first driving circuit 11a, the first power module 3a, the motor windings, and the like, based on inputted respective information items; when detecting an abnormality, the first CPU 10a turns off corresponding-phase one of the upper switching devices 31Ua, 31VA, and 31Wa, corresponding one of the lower switching devices 32Ua, 32VA, and 32Wa, and corresponding one of the electric-rotating-machine relay switching devices 34Ua, 34Va, and 34Wa so that for example, current supply only for a predetermined phase is cut off in accordance with the abnormality. Alternatively, it is also made possible that in order to cut off the power source itself, the power-source-relay switching device 5a is turned off. Furthermore, the first CPU 10a and the second CPU 10b are connected with each other by means of a communication line 14 so that they can mutually transmit and receive information; information to be utilized for controlling and information at a time when an abnormality is detected are transmitted and received. In the communication by means of the communication line 14, high-speed data communication such as SPI (Serial Peripheral Interface) communication is utilized. In this regard, however, the communication method is not limited to SPI communication.

In the present embodiment, the communication line 14 is described with an example of data communication between the first CPU 10a and the second CPU 10b; however, it may be allowed that there is utilized a signal for indicating a state by means of a voltage level such as High level or Low level. The signal may be an analogue one. In addition, it may be allowed that the communication line 14 does not connect the CPUs. For example, the signal line may connect electronic components to be mounted on the control circuit board. The signal line may connect electronic components to be mounted on one of the control circuit boards with a CPU to be mounted on the other thereof.

<Electric Rotating Machine>

The electric rotating machine 2 is a brushless motor in which windings of each of two three-phase systems are delta-connected. A first rotation sensor 17a and a second rotation sensor 17b for detecting the rotation position of the rotor of the brushless motor are mounted. In order to secure the redundant system, respective sensors of the two systems are mounted; the rotation information items therefrom are transmitted to the input circuits 12a and 12b of the first control circuit 16a and the second control circuit 16b, respectively. It may be allowed that the electric rotating machine 2 is not three-phase delta-connected brushless motor but either a three-phase star-connected brushless motor or a motor having dipole-two-pair brushes. Moreover, as is the case with the winding specification of a conventional apparatus, either distributed winding or concentrated winding can be adopted. Furthermore, the electric rotating machine 2 may be a so-called tandem motor having two stators. Even windings of one system or two-system collaboration can be adopted, as far as the configuration can output desired motor rotation speed and torque.

<Electric Rotating Machine Apparatus>

FIG. 2 is a cross-sectional view of the electric rotating machine apparatus 100 according to Embodiment 1. The electric rotating machine apparatus 100 has two-system configuration in which the control circuits 16a and 16b are independent from each other, the power modules 3a and 3b are independent from each other, connectors 43a, 43b, 44a, and 44b are independent from one another, the rotation sensors 17a and 17b are independent from each other, and the winding groups of the electric rotating machine 2 are independent from each other, and so on; thus, the redundancy is secured. In the electric rotating machine apparatus 100, the control unit 1 is provided at the anti-output side of an output axle 21 of the electric rotating machine 2; the electric rotating machine 2 and the control unit 1 are integrated with each other. As far as an apparatus integrated in such a manner is concerned, it is desirable that the maximum outer diameter of the control unit 1 is the same as or smaller than that of the electric rotating machine 2. Accordingly, a structure in which main units are erected in parallel with the output axle 21 is adopted.

The electric rotating machine 2 mainly includes the output axle 21 incorporated in a case 25, a rotor 23, and a stator 22. Two or more permanent magnets are arranged around the rotor 23; multi-phase windings 24 are wound around the stator 22.

A ring-shaped terminal unit 27 with which the winding 24 is connected and then extends to the control unit 1 is disposed close to the upper portion of the winding. An upper bearing 26a and a lower bearing 26b for making the output axle 21 rotate are arranged at the upper and lower sides, respectively, of the drawing. The upper bearing 26a is disposed in the center of a frame 29; the frame 29 is situated at the boundary between the electric rotating machine 2 and the control unit 1 and functions also as a cover for the electric rotating machine 2. Each of winding terminal portions 28a and 28b of the motor penetrates the frame 29 from the ring-shaped terminal unit 27 and then extends into the control unit 1. Three pieces each of the winding terminal portions of the two systems are collectively extended to the periphery of the inner circumference of the control unit 1.

The connectors 43a, 43b, 44a, and 44b are arranged at the uppermost portion of the control unit 1; the first filter 6a and the second filter 6b each of which includes a capacitor and a choke coil are mounted nearby the connectors. The connectors 43a and 43b are the ones in each of which a relatively large current in the power source system flows; each of the connectors 44a and 44b is the one for a small current in the signal system. A columnar portion of a heat sink 41 id disposed in the center of the inside of a housing 15; in the periphery of the columnar portion, there are arranged the first control circuit board 4a, the second control circuit board 4b, and the first power module 3a and the second power module 3b each of which is included in an inverter circuit. A bottom portion 41a of the heat sink 41 has the shape of a circle inscribed in the case 25 of the electric rotating machine 2. The anti-output-side end of the output axle 21 is extended in the center thereof and a sensor magnet 18 is mounted on the anti-output-side end.

<Sensor Circuit Board>

The sensor magnet 18 has a pair of or two or more pairs of magnetic poles; the first rotation sensor 17a and the second rotation sensor 17b are mounted on the surface, of a sensor circuit board 40, that faces the sensor magnet 18. Rotation of the sensor magnet 18 causes a change in the magnetic field; the first rotation sensor 17a and the second rotation sensor 17b independently detect the rotation of the output axle 21. Based on the outputs of the rotation sensors 17a and 17b, the first CPU 10a and the second CPU 10b, respectively, can comprehend the rotation angle of the output axle 21. In this regard, however, it may be allowed that two rotation sensors are incorporated in a single package. FIG. 2 illustrates a configuration in which two rotation sensors are incorporated in a single package. The one-package configuration makes it possible to arrange both the first rotation sensor 17a and the second rotation sensor 17b as close to the center of the sensor magnet 18 as possible. By way of the wiring strip conductors and the electrodes of the sensor circuit board 40, the power-source lines and the signal lines of the first rotation sensor 17a are connected with electrodes at the bottom-end portion of the first control circuit board 4a through the intermediary of a short first terminal group 37a; by way of the wiring strip conductors and the electrodes of the sensor circuit board 40, the power-source lines and the signal lines of the second rotation sensor 17b are connected with electrodes at the bottom-end portion of the second control circuit board 4b through the intermediary of a short second terminal group 37b. A hole is provided in the bottom side of the heat sink 41, and the sensor circuit board 40 is fixed in such a way as to be enclosed by the hole.

Furthermore, the first CPU 10a and the second CPU 10b are connected with each other by means of the communication line 14 (unillustrated in FIG. 2) so that they can mutually transmit and receive information; information to be utilized for controlling and information at a time when an abnormality is detected are transmitted to the other party. The communication line 14 includes the wiring strip conductors and the electrodes of the sensor circuit board 40, the wiring strip conductors and the electrodes of each of the control circuit boards 4a and 4b, the first terminal group 37a, and the second terminal group 37b. As a result, long and large terminal members and the like dedicated to the communication line 14 between the electrodes of the first control circuit board 4a and the electrodes of the second control circuit board 4b are unnecessary and hence no dedicated large wiring space is required; therefore, reduction of the number of components, downsizing, and cost reduction are possible. The first terminal group 37a is provided in order to provide the first rotation sensor 17a on the sensor circuit board 40 and to transmit a sensor signal to the first control circuit board 4a; the second terminal group 37b is provided in order to provide the second rotation sensor 17b on the sensor circuit board 40 and to transmit a sensor signal to the second control circuit board 4b. Accordingly, it is advantageous that the communication line 14 can be secured only by adding the terminals, without providing any extra terminal group.

In FIG. 2, the first terminal group 37a and the second terminal group 37b are attached to the respective electrode groups at the bottom-end portions of the first control circuit board 4a and the second control circuit board 4b, respectively; with short distances, the respective electrode groups are connected with each corresponding one of the electrode groups at the both ends of the sensor circuit board 40. As described above, the first control circuit board 4a, the second control circuit board 4b, and the sensor circuit board 40 are arranged in such a way as to form an angular U-shape; by use of the end portions of the boards on which no component is mounted, the boards are electrically connected. It is advantageous that such arrangement makes it possible to make efficient connection, while securing an effective area for mounting the components of the first control circuit board 4a, the second control circuit board 4b, and the sensor circuit board 40.

However, it is not necessarily required that the first terminal group 37a is mounted on the bottom-end portion of the first control circuit board 4a and on one of the both end portion of the sensor circuit board and that the second terminal group 37b is mounted on the bottom-end portion of the second control circuit board 4b and on the other one of the both end portion of the sensor circuit board 40. When the first terminal group 37a and the second terminal group 37b are mounted on the respective places where the first control circuit board 4a and the second control circuit board 4b, respectively, close to the sensor circuit board 40, it is made possible that the connection can be made with a short terminal. In FIG. 2, the first control circuit board 4a, the second control circuit board 4b, and the sensor circuit board 40 are arranged in such a way as to form an angular U-shape; however, it is also made possible that the first control circuit board 4a, the second control circuit board 4b, and the sensor circuit board 40 are arranged in such a way as to form an H-shape and that the first terminal group 37a and the second terminal group 37b are mounted on respective places other than the bottom-end portions of the first control circuit board 4a and the second control circuit board 4b, respectively. Moreover, it is also made possible that the width of the sensor circuit board 40 is set to be larger than the distance between the first control circuit board 4a and the second control circuit board 4b and that the first terminal group 37a and the second terminal group 37b are mounted on respective places other than the both end portions of the sensor circuit board 40.

<Connector>

The first power-source input 19a and the first signal line 44c from the connectors 43a and 44a, respectively, are electrically connected with the first control circuit board 4a; the second power-source input 19b and the second signal line 44d from the connectors 43b and 44b, respectively, are electrically connected with the second control circuit board 4b. Among the foregoing connections, the first power-source input 19a and the second power-source input 19b are connected by way of the first filter 6a and the second filter 6b, respectively, as represented in the circuit diagram in FIG. 1; electric power is supplied through a bus bar of a relay member 42 attached to the heat sink 41. This bus bar also incorporates a first extension terminal 42a of a first output terminal 3e of the first power module 3a and a second extension terminal 42b of a second output terminal 3f (unillustrated in FIG. 2) of the second power module 3b. It is made possible that the bus bar of the relay member 42 is set to have a free shape and extend in any direction. Meanwhile, the first signal line 44c is connected with the first input circuit 12a of the first control circuit board 4a; the second signal line 44d is connected with the second input circuit 12b of the second control circuit board 4b (12a and 12b are unillustrated in FIG. 2).

<Capacitor>

The capacitors 30Ua, 30Va, and 30Wa are arranged at the outer circumferential side in such a way as to be substantially in parallel with the first control circuit board 4a and to be stacked vertically; the capacitors 30Ub, 30Vb, and 30Wb are arranged at the outer circumferential side in such a way as to be substantially in parallel with the second control circuit board 4b and to be stacked vertically. The respective terminals of the capacitors are connected with the power-source lines of the relay member 42 or the power-source lines wired on the power module 3a or 3b; the main bodies of the capacitors are fixed by supporting member 45a or 45b.

<Heat Sink>

FIG. 3 is a perspective view of the electric rotating machine apparatus 100 according to Embodiment 1, when viewed from the top side. FIG. 3 is a perspective view illustrating principal parts viewed from the connectors; the heat sink 41 whose columnar portion is substantially rectangular-parallelopiped is disposed in the center; the first control circuit board 4a and the second control circuit board 4b are arranged along the respective long sides of the rectangular parallelopiped, and the first power module 3a and the second power module 3b are arranged in such a way as to adhere to the respective short sides thereof. A first signal line 3c of the first power module 3a is connected with the first control circuit board 4a; a second signal line 3d of the second power module 3b is connected with the second control circuit board 4b. The heat sink 41, the first control circuit board 4a, the second control circuit board 4b, the first power module 3a and the second power module 3b are arranged axisymmetric with respect to the output axle 21.

Winding terminal portions 28Ua, 28Va, and 28Wa are arranged at the outer circumference side of the first control circuit board 4a and are connected with the first output terminal 3e of the first power module 3a through the extension terminal 42; winding terminal portions 28Ub, 28Vb, and 28Wb are arranged at the outer circumference side of the second control circuit board 4b and are connected with the second output terminal 3f of the second power module 3b through the extension terminal 42. The sensor circuit board 40 is disposed in the hole that penetrates the bottom portion of the heat sink 41. In other words, the portion of the control unit 1 in the vicinity of the electric rotating machine 2 is utilized as connection positions of the winding terminal portions 28Ua, 28Va, 28Wa, 28Ub, 28Vb, and 28Wb; in the upper portion thereof, the capacitors 30Ua, 30Ub, and the like are stacked. Moreover, because the sensor circuit board 40 is incorporated in a hole in the bottom portion of the heat sink 41, the space is utilized with contrivance and hence downsizing is achieved. Furthermore, the components that generate large heat are made to adhere to the heat sink and the other components are made to be apart from the heat sink, so that heat radiation is improved.

The first control circuit board 4a and the first power module 3a are arranged along the respective sides of the heat sink in such a way as to be adjacent to each other, and the second control circuit board 4b and the second power module 3b are arranged along the respective sides of the heat sink in such a way as to be adjacent to each other; as a result, the control circuit boards 4a and 4b and the power modules 3a and 3b of the two systems are each separated and independent from each other for each of the systems. Moreover, because the control circuit boards 4a and 4b and the power modules 3a and 3b are arranged axisymmetric with respect to the output axle 21, any one of the systems can be connected with the three-phase terminal portions of the motor.

Two kinds of connectors, i.e., a connector for the power-source system and a connector for the signal system are provided; however, it may be allowed that one kind of connector is utilized and is separated into the power-source system and the signal system in the control unit.

Effect of Embodiment 1

The electric rotating machine apparatus 100 according to Embodiment 1 includes
  the winding 24a of the first system,
  the winding 24b of the second system,
  the electric rotating machine 2 having the output axle 21,
  a sensor that detects an operating state of the electric rotating machine 2,
  the first control circuit board 4a on which the first control circuit 16a for controlling a current in the winding of the first system is mounted,
  the second control circuit board 4b that faces the first control circuit board 4a with respect to the axis line of the output axle 21 and on which the second control circuit 16b for controlling a current in the winding of the second system is mounted,
  the communication line 14 that connects the first control circuit 16a with the second control circuit 16b,
  the sensor circuit board 40 that faces the axle end of the output axle 21 and on which the sensor and the communication line 14 are mounted,
  the first terminal group 37a that electrically connects the first control circuit board 4a with the sensor circuit board 40, and
  the second terminal group 37b that electrically connects the second control circuit board 4b with the sensor circuit board 40.

Because as described above, the arrangement of the members is contrived, the spaces in the control units 1a and 1b can effectively be utilized and hence downsizing can be achieved. Because the respective systems having the same shape and configuration are formed separately and independently from each other, the redundancy can be secured and the heat-radiation performance can be improved.

The first control circuit board 4a and the second control circuit board 4b are separated from each other so as to be different bodies, and the first control circuit board 4a and the second control circuit board 4b are connected by the communication line 14 through the intermediary of the sensor circuit board 40, so that the first terminal group 37a and the second terminal group 37b, which are connection portions, are downsized and hence Embodiment 1 contributes to cost reduction. The first terminal group 37a and the second terminal group 37b are originally necessary components for transmitting sensor signals to the first control circuit board 4a and the second control circuit board 4b; because the communication line 14 can be secured by utilizing these components and adding terminals, Embodiment 1 contributes to downsizing and cost reduction.

As illustrated in FIG. 2, the first control circuit board 4a, the second control circuit board 4b, and the sensor circuit board 40 are arranged in such a way as to form an angular U-shape; the first terminal group 37a connects the electrodes at the bottom-end portion of the first control circuit board 4a with the electrodes at one end of the sensor circuit board 40; the second terminal group 37b connects the electrodes at the bottom-end portion of the second control circuit board 4b with the electrodes at the other end of the sensor circuit board 40.

As described above, the arrangement that achieves electrical connection between the boards by use of the end portions of the boards on each of which no component is mounted makes it possible that while the effective area for mounting the first control circuit board 4a, the second control circuit board 4b, and the sensor circuit board 40 is secured, efficient connection is achieved.

As illustrated in FIG. 2, the sensors 17a and 17b for detecting the rotation angle of the electric rotating machine 2 are provided on the sensor circuit board. Because such arrangement makes it possible to accurately manage the distance between the output axle of the electric rotating machine and the sensors 17a and 17b, the rotation angle of the output axle can accurately be detected. Because accurate detection of the rotation angle of the output axle makes it possible to optimize the timing of application of a current to the winding of the electric rotating machine, the performance of the electric rotating machine apparatus can be raised.

2. Embodiment 2

Figure 4:
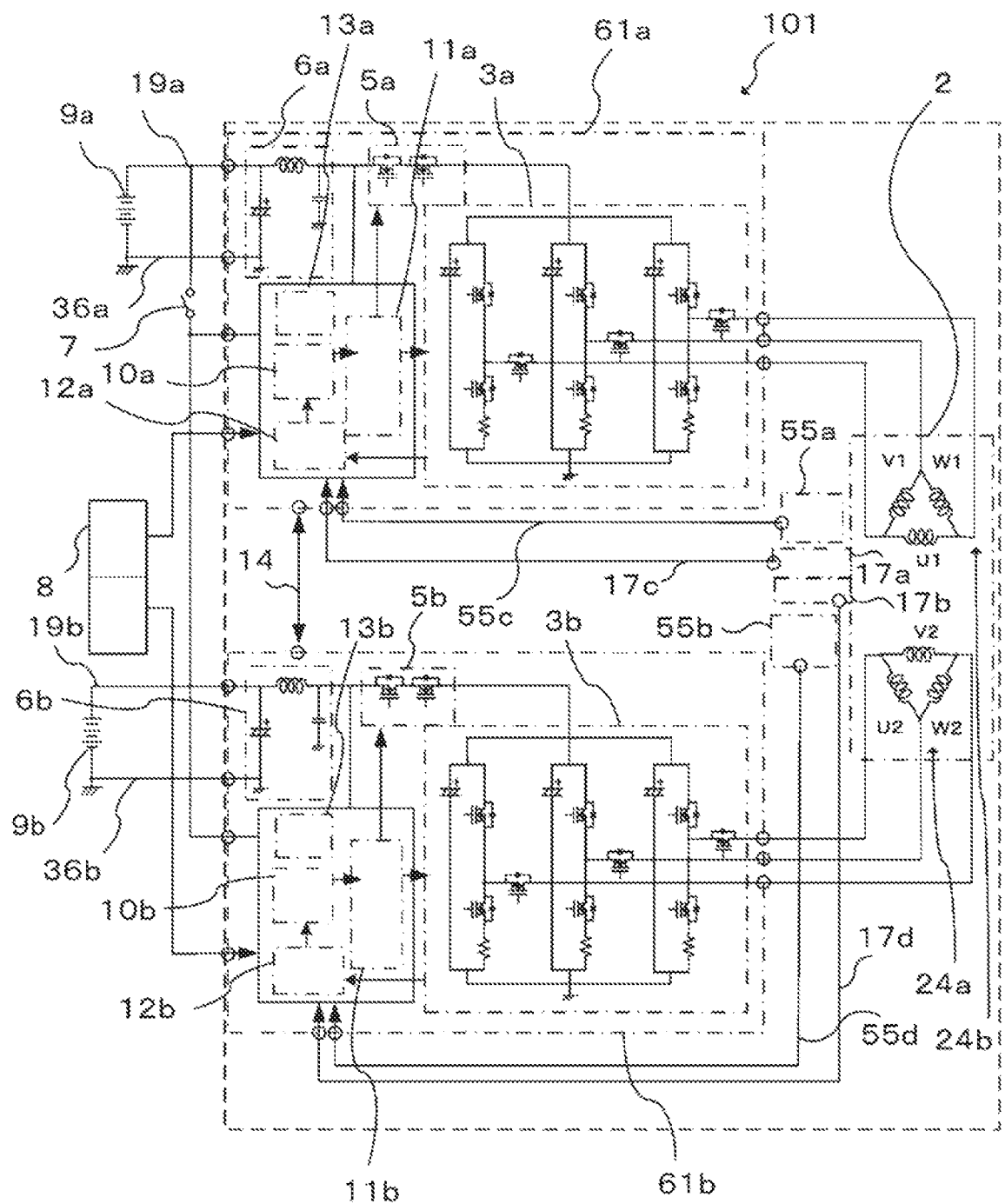
FIG. 4 is a circuit diagram of an electric rotating machine apparatus according to Embodiment 2.
Figure 5:
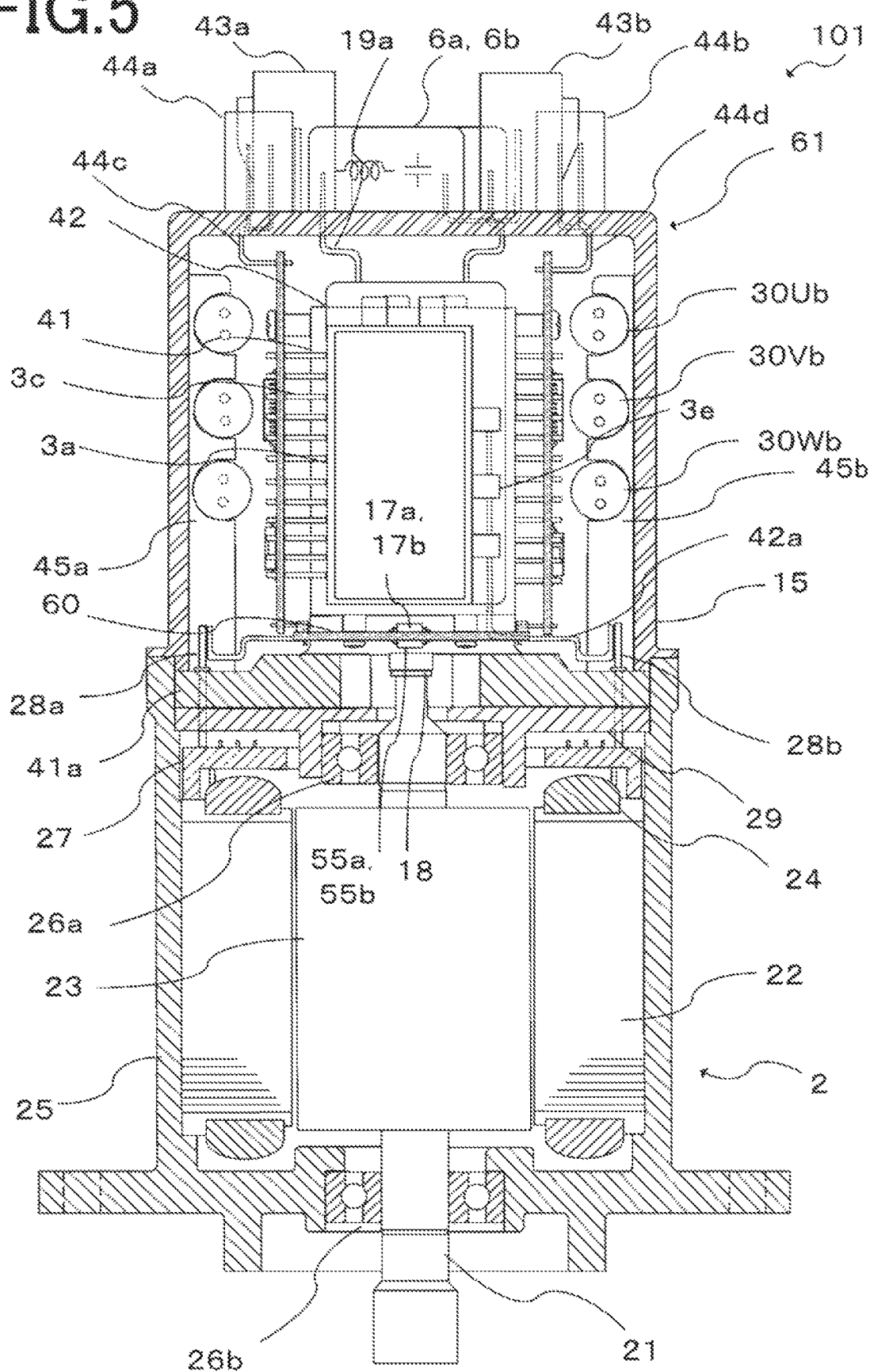
FIG. 5 is a cross-sectional view of the electric rotating machine apparatus according to Embodiment 2.

FIG. 4 is a circuit diagram of an electric rotating machine apparatus 101 according to Embodiment 2. FIG. 5 is a cross-sectional view of the electric rotating machine apparatus 101 according to Embodiment 2. FIGS. 4 and 5 of Embodiment 2 are different from FIGS. 1 and 2 in that a first temperature sensor 55a and a second temperature sensor 55b are provided on a sensor circuit board 60.

The first temperature sensor 55a and the second temperature sensor 55b illustrated in each of FIGS. 4 and 5 are arranged on the sensor circuit board 60 so as to measure the temperature of the vicinity of the electric rotating machine 2. The first temperature sensor 55a and the second temperature sensor 55b each measure the temperature of the electric rotating machine 2 and then output the measured temperature values to a first control unit 61a and a second control unit 61b, respectively. It may be allowed that two or more pieces each of the first temperature sensors 55a and the second temperature sensor 55b are provided for the respective systems. It may be allowed that two temperature sensors are incorporated in a single package. FIG. 5 illustrates a configuration in which two temperature sensors are incorporated in a single package.

In the electric rotating machine apparatus 101, it is required to monitor or estimate the temperature and then limit the current so that at a time of energization, the temperature of each of the portions falls with the rating. Because suggesting limitation of the output, limitation of the current directly links with the merchantability. Accordingly, it is required to apply a maximally large current that is within the rating. Accordingly, accurate measurement of the temperatures of the respective portions makes it possible to energize up to the limitation of the energization; thus, the performance of the electric rotating machine 2 can be raised.

In the electric rotating machine apparatus 101, the winding 24 of the electric rotating machine 2 or the motor magnet of the electric rotating machine 2 is a temperature-monitoring subject, because the temperature thereof rises due to application of the current. Therefore, it is important that in order to measure the temperature of the electric rotating machine 2, the first temperature sensor 55a and the second temperature sensor 55b are arranged at the positions that are as close to the electric rotating machine 2 as possible. As each of the first temperature sensor 55a and the second temperature sensor 55b, a thermistor or the like is utilized.

Two or more permanent magnets are arranged around the rotor 23; multi-phase windings 24 are wound around the stator 22. In the configuration according to Embodiment 2, the sensor circuit board 60 is close to the electric rotating machine 2; therefore, mounting the first temperature sensor 55a and the second temperature sensor 55b on the sensor circuit board 60 makes it possible to accurately measure the temperature of the vicinity of the motor. In FIG. 5, it may be allowed that the side of the sensor circuit board 60 on which the first temperature sensor 55a and the second temperature sensor 55b are arranged and the side thereof on which the first rotation sensor 17a and the second rotation sensor 17b are arranged are reversed each other. In addition, it may be allowed that the first temperature sensor 55a, the second temperature sensor 55b, the first rotation sensor 17a, and the second rotation sensor 17b are all mounted on any one of the sides.

3. Embodiment 3

Figure 6:
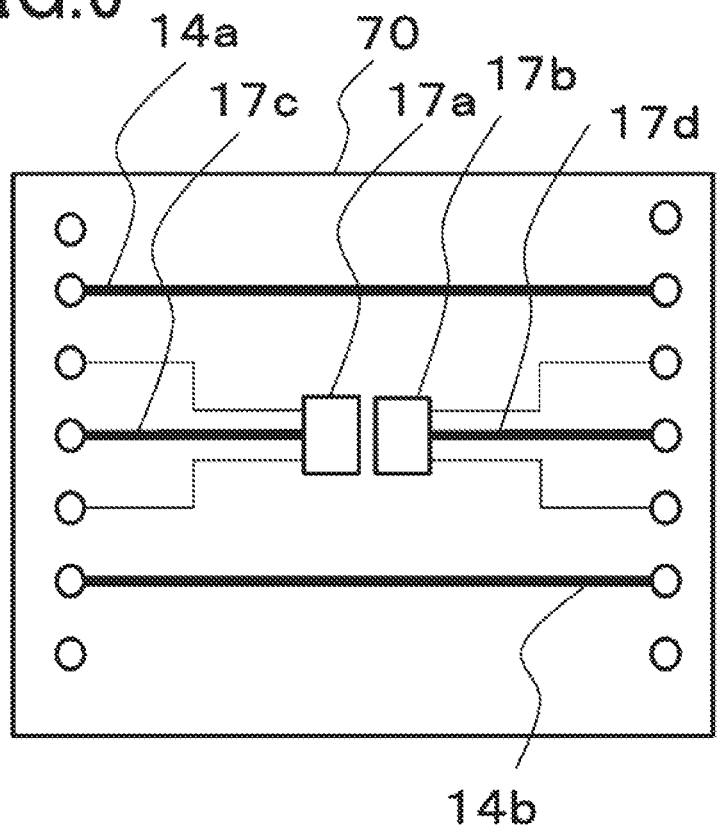
FIG. 6 is a top view of a sensor circuit board according to Embodiment 3.

FIG. 6 is a top view of a sensor circuit board 70 of an electric rotating machine apparatus according to Embodiment 3. The top surface of the sensor circuit board 70 faces the sensor magnet 18 at the axle end of the output axle 21 of the electric rotating machine 2. On the sensor circuit board 70 illustrated in FIG. 6, a first communication line 14a and a second communication line 14b are symmetrically arranged with respect to the first rotation sensor 17a and the second rotation sensor 17b. There exist two communication lines 14 for connecting the first CPU 10a with the second CPU 10b so that they can interchange information items; with the first communication line 14a and the second communication line 14b, there is illustrated an example in which upward communication and downward communication are realized.

The communication between the first CPU 10a and the second CPU 10b can be realized even with a single communication line. However, in order to make it possible to perform simultaneous interactive communication, the upward and downward communication lines are separately provided, so that the instantaneousness of the communication can be secured. It may be allowed that two or more communication lines are secured for each of the upward communication and the downward communication.

In FIG. 6, the first rotation sensor 17a and the second rotation sensor 17b are mounted on the central portion of the sensor circuit board 70. This is because the distances among the sensor magnet 18 at the axle end of the output axle 21 of the electric rotating machine 2, the first rotation sensor 17a, and the second rotation sensor 17b are managed so that the rotation is accurately detected. As a result, the detecting accuracy for the first rotation sensor 17a and the second rotation sensor 17b can be raised. Providing the first rotation sensor 17a and the second rotation sensor 17b on the central portion of the sensor circuit board 70 makes it possible to accurately set the position thereof with respect to the sensor magnet by finely adjusting the mounting position of the sensor circuit board 70.

In FIG. 6, there has been explained the case where the first rotation sensor 17a and the second rotation sensor 17b are provided on the sensor circuit board 70; however, the same explanation can be applied to the case where the first temperature sensor 55a and the second temperature sensor 55b are provided thereon. This is because providing the first temperature sensor 55a and the second temperature sensor 55b on the central portion of the sensor circuit board 70 makes it possible to detect the temperature of the vicinity of the output axle 21, which is a temperature representative point of the electric rotating machine 2.

Because the first rotation sensor 17a and the second rotation sensor 17b are not mounted on the periphery portion of the sensor circuit board 70, the first communication line 14a and the second communication line 14b can be provided on that area. Because it is made possible to effectively utilize the mountable area of the sensor circuit board 70, Embodiment 3 can also contribute to downsizing of the sensor circuit board 70, resulting in cost reduction. Arranging the two, i.e., the upward and downward communication lines symmetrically with respect to the first rotation sensor 17a and the second rotation sensor 17b makes it possible that the first communication line 14a, the second communication line 14b, a first-rotation-sensor communication line 17c, and a second-rotation-sensor communication line 17d are provided spaced apart from one another, in a balanced manner; thus, the mounting area of the sensor circuit board 70 can effectively be utilized, while superimposition of noise is prevented.

In FIG. 6, there has been explained the case where the first rotation sensor 17a and the second rotation sensor 17b are provided on the sensor circuit board 70; however, the same explanation can be applied to the case where the first temperature sensor 55a and the second temperature sensor 55b are provided on the central portion of the sensor circuit board 70. Arranging the two, i.e., the upward and downward communication lines symmetrically with respect to the first temperature sensor 55a and the second temperature sensor 55b makes it possible that the first communication line 14a, the second communication line 14b, a first-temperature-sensor communication line 55c, and a second-temperature-sensor communication line 55d are provided spaced apart from one another, in a balanced manner; thus, the mounting area of the sensor circuit board 70 can effectively be utilized, while superimposition of noise is prevented.

4. Embodiment 4

Figure 7:
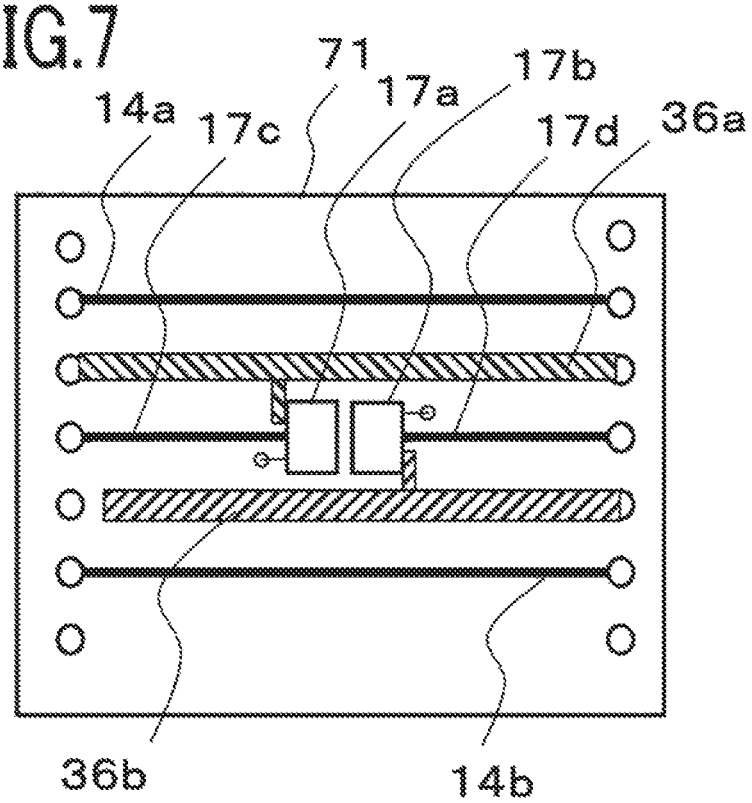
FIG. 7 is a top view of a sensor circuit board according to Embodiment 4.
Figure 8:
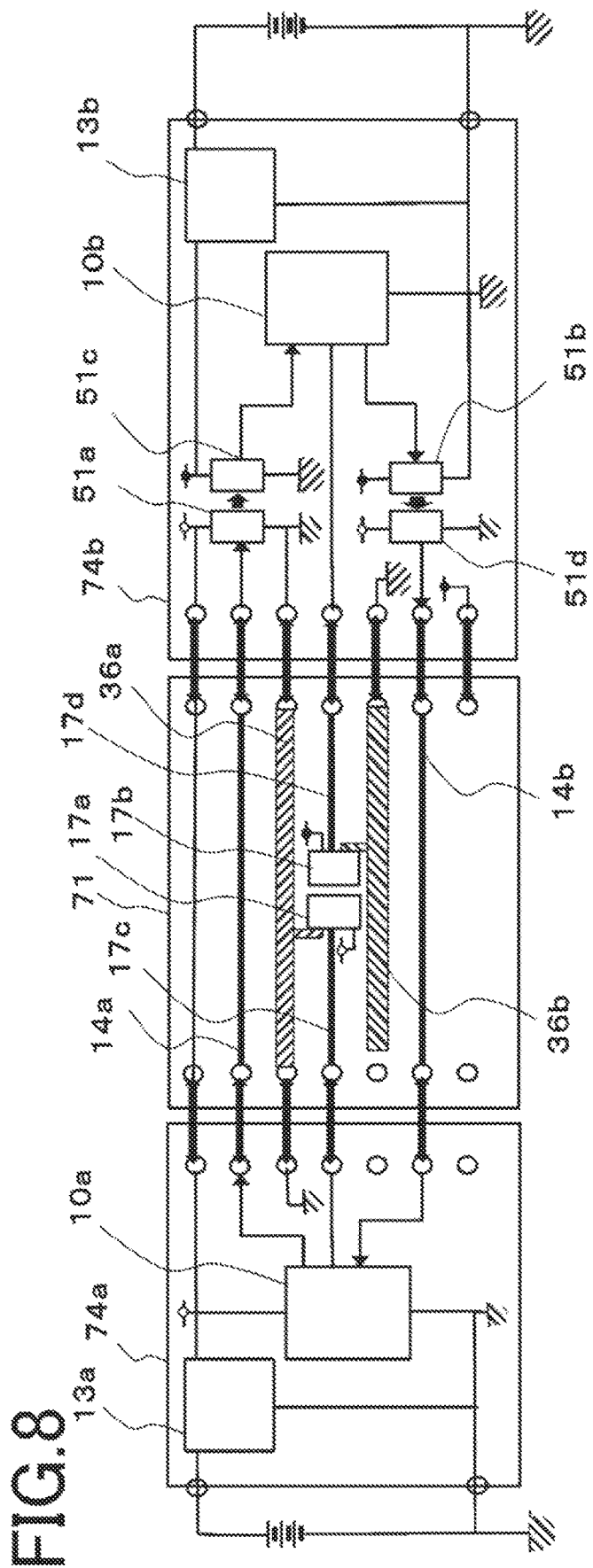
FIG. 8 is a board configuration diagram related to communication lines according to Embodiment 4.

FIG. 7 is a top view of a sensor circuit board 71 according to Embodiment 4. The top surface of the sensor circuit board 71 faces the sensor magnet 18 at the axle end of the output axle 21 of the electric rotating machine 2. FIG. 8 is a board configuration diagram related to the communication lines 14a and 14b according to Embodiment 4; the respective boards to be connected with one another in an angular U-shape are developed on a plane, and the flows of signals are explained.

In FIG. 7, the first rotation sensor 17a and the second rotation sensor 17b are mounted on the central portion of the sensor circuit board 71, and each of the first-rotation-sensor communication line 17c and the second-rotation-sensor communication line 17d is provided in such a way as to traverse the central portion of the sensor circuit board 71. The first communication line 14a and the second communication line 14b are provided in the peripheral area of the sensor circuit board 71; a first ground 36a is disposed between the communication line 14a and the first-rotation-sensor and second-rotation-sensor communication lines 17c and 17d; a second ground 36b is disposed between the communication line 14b and the first-rotation-sensor and second-rotation-sensor communication lines 17c and 17d.

This is because a shielding effect is exerted by arranging the ground lines therebetween and hence crosstalk can be prevented from occurring between the first-rotation-sensor and second-rotation-sensor communication lines 17c and 17d and the communication line 14a or the communication line 14b. Malfunctions can also be prevented by reducing noise in each of the signals.

In FIG. 7, the first rotation sensor 17a and the second rotation sensor 17b are described; however, this description can be applied to the first temperature sensor 55a and the second temperature sensor 55b. The first temperature sensor 55a and the second temperature sensor 55b are arranged at the center of the sensor circuit board 71; the first communication line 14a and the second communication line 14b are provided in the peripheral area of the sensor circuit board 71; respective ground lines are arranged between the first-temperature-sensor and second-temperature-sensor communication lines 55c and 55d and the communication line 14a and between the first-temperature-sensor and second-temperature-sensor communication lines 55c and 55d and the communication line 14b; as a result, noise can be reduced.

FIG. 8 represents an example in which in the case where the respective pairs of the power source and the ground of a first control circuit board 74a and a second control circuit board 74b are separated from each other, the communication is established in such a way that the communication line 14a is equipped with isolators 51a and 51c and the communication line 14b is equipped with isolators 51b and 51d so that the first CPU 10a and the second CPU 10b can interchange information items. Each of the isolators 51a, 51b, 51c, and 51d in the present embodiment signifies a signal isolator having a function of isolating an input signal from an output signal; there exist methods in each of which a photo-coupler, a capacitor, an inductance, or the like is utilized. In FIG. 8, the isolators 51a, 51b, 51c, and 51d are mounted on the second control circuit board 4b; however, the isolators 51a and 51c function as a pair and the isolators 51b and 51d function as a pair. In the present embodiment, as the signal isolator, a photo-coupler is assumed; the signal isolator may be described as a block for each function. The first power-source circuit 13a supplies a power source to the isolators 51a and 51b; the second power-source circuit 13b supplies a power source to the isolators 51b and 51d.

5. Embodiment 5

Figure 9:
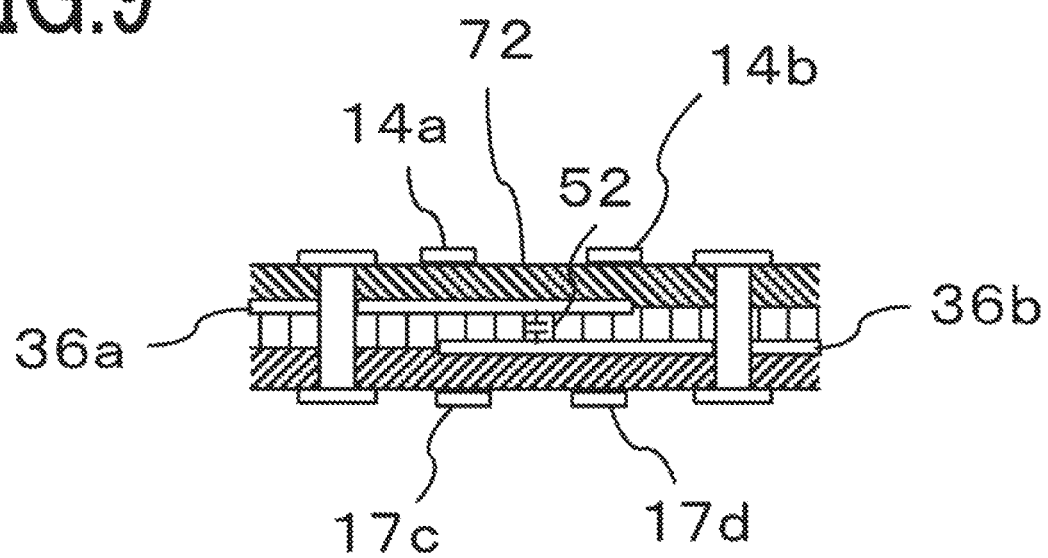
FIG. 9 is a cross-sectional view of a sensor circuit board according to Embodiment 5.
Figure 10:
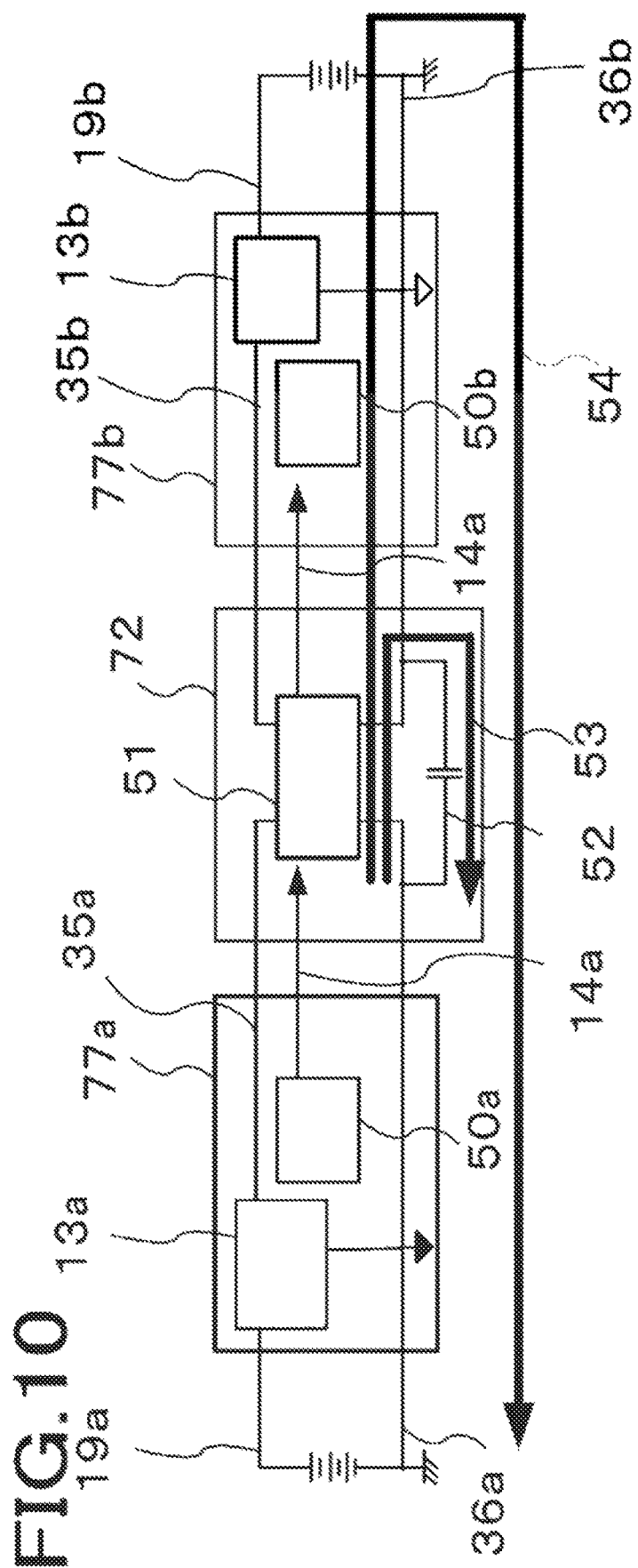
FIG. 10 is a board configuration diagram related to a communication line according to Embodiment 5.

FIG. 9 is a cross-sectional view of a sensor circuit board 72 according to Embodiment 5. FIG. 10 is a board configuration diagram related to the communication lines 14a and 14b according to Embodiment 5; the respective boards to be connected with one another in an angular U-shape are developed in a plane, and the flows of signals are explained.

In Embodiment 5, there is described an example in which as the sensor circuit board 72, a multi-layer board including three or more layers is utilized; FIG. 9 illustrates an example in which four printed-wiring layers are provided. In FIG. 9, because the first ground 36a and the second ground 36b are printed inside the sensor circuit board 72, grounds are arranged between the first and second communication lines 14a and 14b formed on the top surface and the first-rotation-sensor and second-rotation-sensor communication lines 17c and 17d formed on the bottom surface. Accordingly, although in FIG. 7, the respective ground lines are arranged in a planar manner between the communication line 14a and the rotation-sensor signal lines 17c and 17d and between the communication line 14b and the rotation-sensor signal lines 17c and 17d, the grounds are sterically arranged between the communication lines 14a and 14b and the rotation-sensor signal lines 17c and 17d in FIG. 9.

A shielding effect is exerted by arranging the ground lines therebetween as illustrated in FIG. 9 and hence crosstalk can be prevented from occurring between the rotation-sensor communication lines 17c and 17d and the communication lines 14a and 14b; this effect is the same as that in FIG. 7 according to Embodiment 4. Malfunctions can also be prevented by reducing noise in each of the signals.

In FIG. 9, the first rotation sensor 17a and the second rotation sensor 17b are described; however, this description can be applied to the first temperature sensor 55a and the second temperature sensor 55b. In the case where the first temperature sensor 55a and the second temperature sensor 55b are mounted on the bottom surface of the sensor circuit board 71, respective ground lines are arranged between the first and second communication lines 14a and 14b formed on the top surface thereof and the first-temperature-sensor and second-temperature-sensor communication lines 55c and 55d formed on the bottom surface thereof; as a result, noise can be reduced.

FIG. 10 is a board configuration diagram related to the communication lines 14a and 14b according to Embodiment 5; an isolator 51 is mounted on the sensor circuit board 72. FIG. 10 represents the first communication line 14a between a first control circuit board 77a and a second control circuit board 77b; a signal is transmitted to the second control circuit board 77b by way of the isolator 51. In FIG. 10, the description for the second communication line 14b is omitted.

In FIG. 10, there is described a case where as the isolator 51, a coupling-method isolator formed of a capacitor is utilized. Although the isolator 51 performs direct-current isolation, noise as an AC signal may intrude into a signal circuit 50b from a signal circuit 50a. In the case where noise has intruded into signal circuit 50b, the EMI performance is deteriorated if no return path through which the signal returns is provided. In the case where as indicated by a path 54 in FIG. 10, noise as an AC signal intrudes into the signal circuit 50b from the signal circuit 50a and then propagates through the second ground 36b and the first ground 36a, the noise is scattered. Therefore, the EMI performance is deteriorated. Even when the first ground 36a and the second ground 36b are separated from each other, a capacitive-coupling component exists somewhere in the case, depending on the wiring in a vehicle; thus, noise may intrude. Therefore, measures for the noise propagation are required.

Even when noise has intruded into the signal circuit 50b from the signal circuit 50a, providing a return-path capacitive component 52 represented in FIG. 10 makes the noise immediately return by way of the capacitive component 52, as indicated by a path 53; thus, noise propagation to the surroundings can be reduced. FIG. 9 illustrates the case where the return-path capacitive component 52 is formed of the ground strip conductors of the sensor circuit board 72.

As illustrated in the cross-sectional view of the sensor circuit board 72 in FIG. 9, the respective layers of the first ground 36a and the second ground 36b are formed at the upper and lower portion of the multi-layer substrate in such a way as to insert an insulating layer therebetween. The arrangement of the respective layers with the insulating layer inserted therebetween causes capacitive coupling that functions as a capacitor.

As a result, even when the coupling-method isolator 51 based on a capacitor is utilized, noise propagation can be reduced by making the respective layers of the first ground 36a and the second ground 36b face each other across the insulating layer in the sensor circuit board 72. In addition, in FIG. 10, there has been described an example where the isolator 51 is utilized; however, even when the isolator 51 is not utilized, the capacitive component 52 effectively works to reduce noise propagation.

6. Embodiment 6

Figure 11:
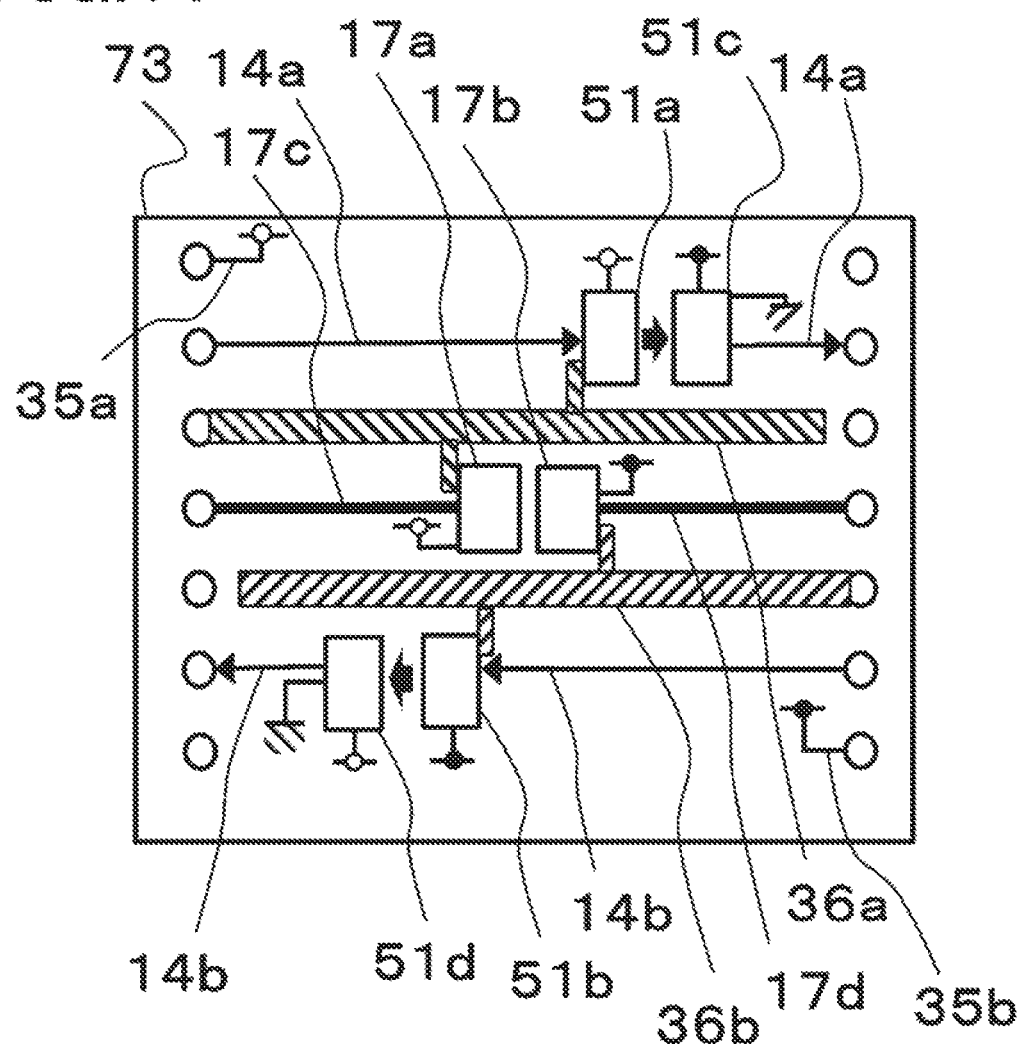
FIG. 11 is a top view of a sensor circuit board according to Embodiment 6.
Figure 12:
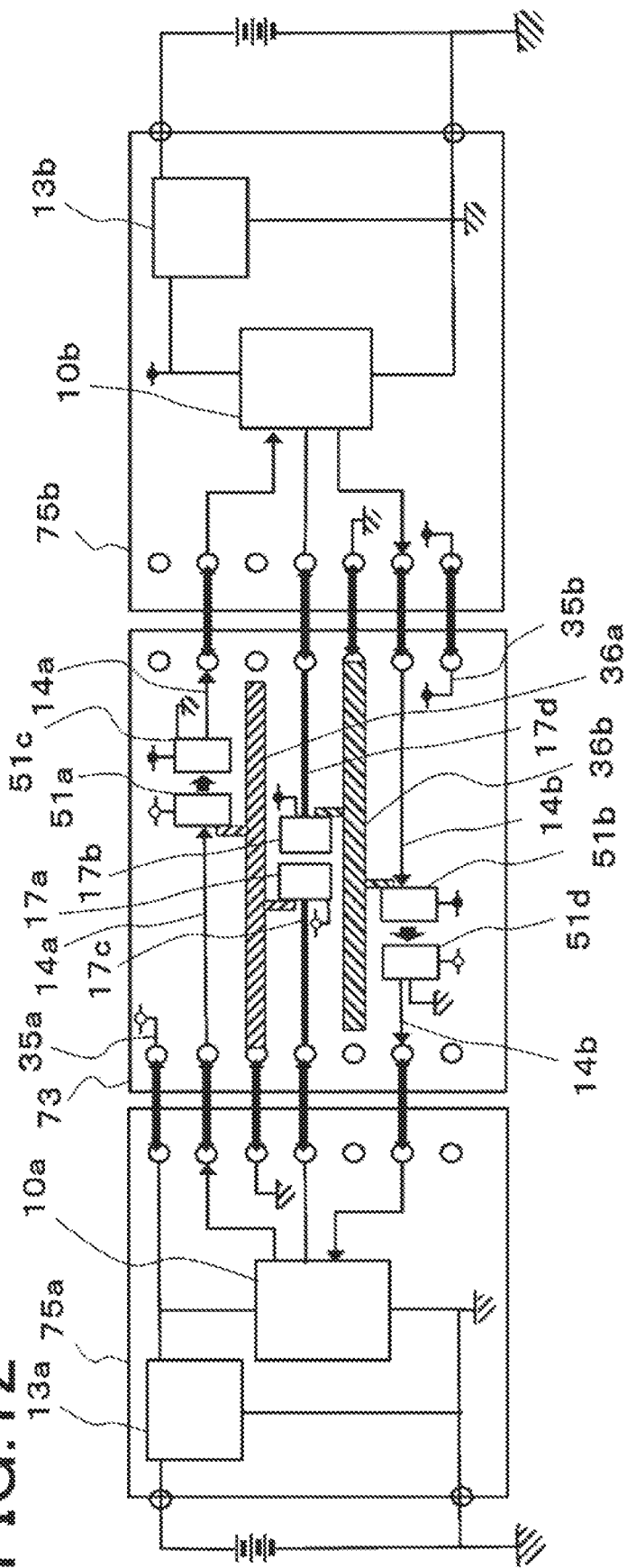
FIG. 12 is a board configuration diagram related to communication lines according to Embodiment 6.

FIG. 11 is a top view of a sensor circuit board 73 according to Embodiment 6. The top surface of the sensor circuit board 73 faces the sensor magnet 18 at the axle end of the output axle 21 of the electric rotating machine 2. FIG. 12 is a board configuration diagram related to the communication lines 14a and 14b according to Embodiment 6; the respective boards to be connected with one another in an angular U-shape are developed on a plane, and the flows of signals are explained.

In each of FIGS. 11 and 12, the isolators 51a and 51c are provided in the first communication line 14a, and the isolators 51b and 51d are provided in the second communication line 14b. In the case where the respective pairs of the power source and the ground of a first control circuit board 75a and a second control circuit board 75b are separated from each other, the communication can be established in such a way that the communication line 14a is equipped with isolators 51a and 51c and the communication line 14b is equipped with isolators 51b and 51d so that the first CPU 10a and the second CPU 10b can interchange information items. Each of the isolators 51a, 51b, 51c, and 51d in the present embodiment signifies a signal isolator having a function of isolating an input signal from an output signal; there exist methods in each of which a photo-coupler, a capacitor, an inductance, or the like is utilized. The isolators 51a and 51c function as a pair and the isolators 51b and 51d function as a pair. In the present embodiment, as the signal isolator, a photo-coupler is assumed, and the explanation is made with blocks that each include a pair of isolators; however, as is the case with the isolator 51 in FIG. 10, the signal isolator may be described as a block for each function.

In the case where the pair of the isolators 51a and 51c and the pair of the isolators 51b and 51d are provided in the first communication line 14a and the second communication line 14b, respectively, the isolators 51a, 51b, 51c, and 51d can be provided on either the first control circuit board or the second control circuit board. FIG. 8 represents the case where the isolators 51a, 51b, 51c, and 51d are provided on the second control circuit board 74b.

In the case where as illustrated in FIG. 11, the isolators 51a, 51b, 51c, and 51d are provided in the sensor circuit board 73, mounting of the isolators 51a, 51b, 51c, and 51d on the first control circuit board 75a or the second control circuit board 75b can be avoided, as represented in FIG. 12.

Because the first CPU 10a, the first power-source circuit 13a, and many other components are mounted on the first control circuit board 75a, the mounting area thereof has no enough margin; because the second CPU 10b, the second power-source circuit 13b, and many other components are mounted on the second control circuit board 75b, the mounting area thereof has no enough margin. In contrast, only the first rotation sensor 17a, the second rotation sensor 17b, the first temperature sensor 55a, the second temperature sensor 55b, the first terminal group 37a, the second terminal group 37b, and the like may be mounted on the sensor circuit board 73. In addition to the foregoing components, the respective wiring strip conductors of the first communication line 14a, the second communication line 14b, the first-rotation-sensor communication line 17c, the second-rotation-sensor communication line 17d, the first-temperature-sensor communication line 55c, the second-temperature-sensor communication line 55d, and the like, and the respective wiring strip conductors of the first ground 36a, the second ground 36b, a first power-source output 35a, and a second power-source output 35b merely pass through the sensor circuit board 73.

Thus, in the case where as illustrated in FIG. 11, the isolators 51a, 51b, 51c, and 51d are mounted on the sensor circuit board 73, it is made possible to take mounting balance among the boards and to achieve downsizing of the overall electric rotating machine apparatus and cost reduction.

In FIG. 11, the pair of the isolators 51a and 51c and the pair of isolators 51b and 51d on the sensor circuit board 73 are connected with the first communication line 14a and the second communication line 14b, respectively. However, the isolator can be applied also to each of the first rotation sensor 17a, the second rotation sensor 17b, the first temperature sensor 55a, and the second temperature sensor 55b. In particular, in the case where the power source and the ground for the rotation sensor or the temperature sensor are supplied only from one of the first control circuit board 4b and the second control circuit board 4b or in the case where only a single rotation sensor or temperature sensor is utilized and the sensor signal is shared with the first control circuit board 75a and the second control circuit board 75b, the signal is transmitted by way of the isolator, so that even when the power source and the ground for the first control circuit board 75a are each separated from the power source and the ground for the first control circuit board 75a, the sensor signal can correctly be received.

In FIG. 11, the first rotation sensor 17a and the second rotation sensor 17b are mounted on the central portion of the sensor circuit board 73. This is because the distances among the sensor magnet 18 at the axle end of the output axle 21 of the electric rotating machine 2, the first rotation sensor 17a, and the second rotation sensor 17b are managed so that the rotation is accurately detected. Then, the isolators 51a, 51b, 51c, and 51d are mounted on the outer peripheral portion of the sensor circuit board 73, where no component is mounted.

Mounting the isolators 51a, 51b, 51c, and 51d on the area where no component is mounted makes it possible that the area where the components of the sensor circuit board 73 are mountable is effectively utilized and contributes to downsizing of the sensor circuit board and cost reduction. Moreover, because mounting the isolators 51a, 51b, 51c, and 51d on the outer peripheral portion of the sensor circuit board 73 results in arrangement of the two, i.e., the upward and downward communication lines on the outer peripheral portion of the sensor circuit board 73, it is made possible that the first communication line 14a, the second communication line 14b, the first-rotation-sensor communication line 17c, and the second-rotation-sensor communication line 17d are provided spaced apart from one another and in a balanced manner; thus, the mounting area of the sensor circuit board 73 can effectively be utilized, while superimposition of noise is prevented.

Furthermore, in FIG. 11, the first rotation sensor 17a and the second rotation sensor 17b are mounted on the central portion of the sensor circuit board 73, and the isolators 51a and 51c and the isolators 51b and 51d are symmetrically mounted with respect to the first rotation sensor 17a and the second rotation sensor 17b.

because arranging the isolators 51a, 51b, 51c, and 51d in such a manner results in arranging the two, i.e., the upward and downward communication lines spaced evenly apart from each other on the outer peripheral portion of the sensor circuit board 73, it is made possible that the first communication line 14a, the second communication line 14b, the first-rotation-sensor communication line 17c, and the second-rotation-sensor communication line 17d are provided spaced apart from one another and in a balanced manner; thus, the mounting area of the sensor circuit board 73 can effectively be utilized, while superimposition of noise is prevented.

In FIG. 11, the first rotation sensor 17a and the second rotation sensor 17b are described; however, this description can be applied to the first temperature sensor 55a and the second temperature sensor 55b. The first temperature sensor 55a and the second temperature sensor 55b are arranged on the central portion of the sensor circuit board 73, and the isolators 51a and 51c and the isolators 51b and 51d are mounted at the outsides of the first temperature sensor 55a and the second temperature sensor 55b, respectively, or in a symmetrical manner so that distances among the components are secured; thus, the mounting area of the sensor circuit board 73 can effectively be utilized, while intrusion of noise is prevented.

7. Embodiment 7

Figure 13:
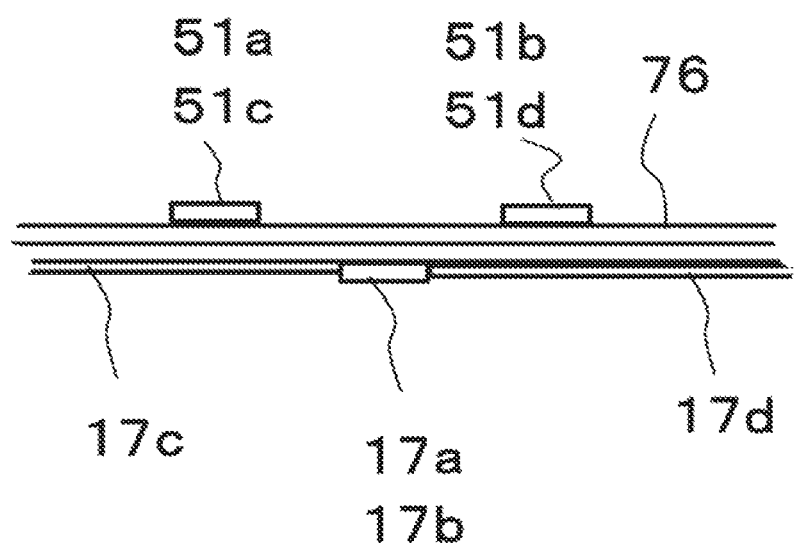
FIG. 13 is a cross-sectional view of a sensor circuit board according to Embodiment 7.

FIG. 13 is a cross-sectional view of a sensor circuit board 76 according to Embodiment 7. In FIG. 13, the first and second rotation sensors 17a and 17b and the isolators 51a, 51b, 51c, and 51d are mounted on the respective opposite sides of the sensor circuit board 76.

Mounting the first and second rotation sensors 17a and 17b and the isolators 51a, 51b, 51c, and 51d on the respective opposite sides of the sensor circuit board 76 makes it possible that the isolators 51a, 51b, 51c, and 51d are separated as much as possible from the first and second rotation sensors 17a and 17b and hence noise is prevented from intruding into the first and second rotation sensors 17a and 17b.

In FIG. 13, the first rotation sensor 17a and the second rotation sensor 17b are described; however, this description can be applied to the first temperature sensor 55a and the second temperature sensor 55b. Also with regard to the temperature sensors, mounting the temperature sensors 55a and 55b and the isolators 51a, 51b, 51c, and 51d on the respective opposite sides of the sensor circuit board 76 makes it possible that the distances among the components are secured and hence intrusion of noise is prevented.

8. Embodiment 8

Figure 14:
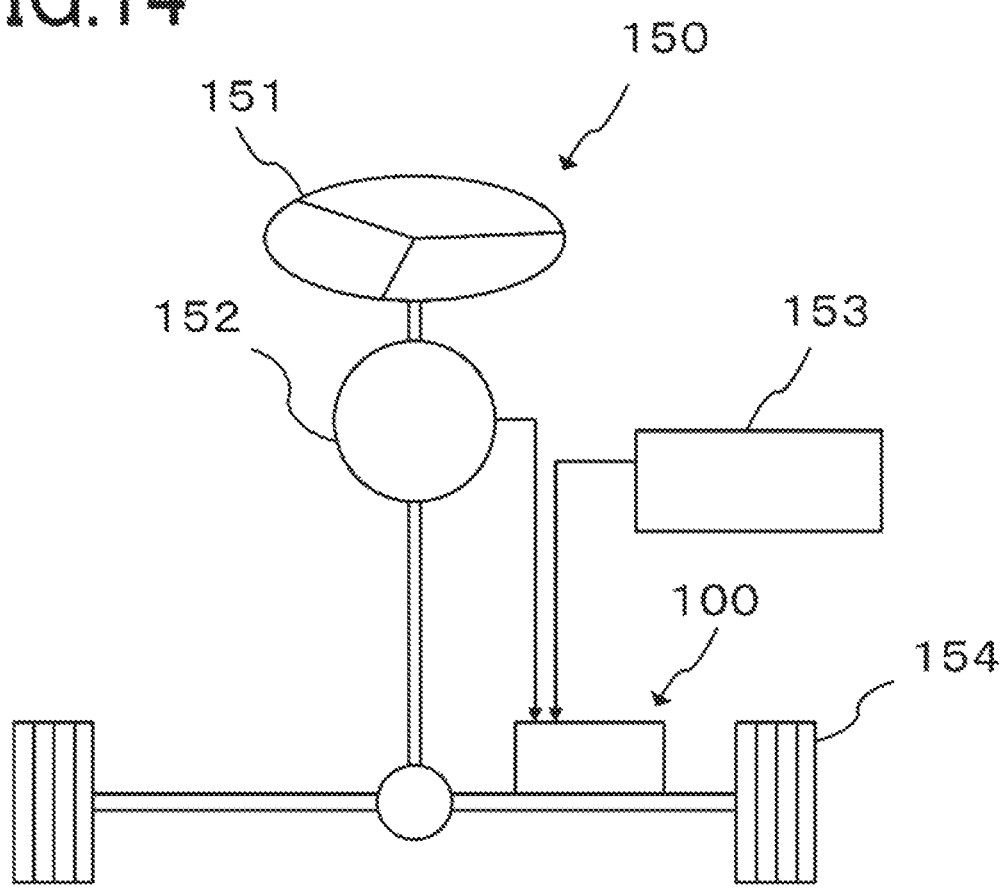
FIG. 14 is a configuration diagram of an electric power steering apparatus according to Embodiment 8.

FIG. 14 is a configuration diagram of an electric power steering apparatus 150 according to Embodiment 8. By use of FIG. 14, there will be explained an example in which the electric rotating machine apparatus 100 is applied to the electric power steering apparatus 150 to be mounted in a vehicle. FIG. 14 is an overall configuration diagram of the electric power steering apparatus 150 and illustrates an example of a rack-type electric power steering apparatus.

When a driver makes the steering mechanism of a vehicle generate steering torque by means of a steering wheel 151, a torque sensor 152 detects the steering torque and then outputs it to the electric rotating machine apparatus 100. In addition, a speed sensor 153 detects the traveling speed of the vehicle and then outputs it to the electric rotating machine apparatus 100. Based on the inputs from the torque sensor 152 and the speed sensor 153, the electric rotating machine apparatus 100 generates auxiliary torque for supplementing the steering torque and then supplies it to the steering mechanism of front wheels 154 of the vehicle. The torque sensor 152 and the speed sensor 153 are included in the sensor group 8 in FIG. 1. It may be allowed that the electric rotating machine apparatus 100 generates auxiliary torque based on inputs other than the inputs from the torque sensor 152 and the speed sensor 153. Downsizing of an electric rotating machine apparatus to be applied to an electric power steering apparatus raises the mountability of the electric rotating machine apparatus for the vehicle.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present disclosure. For example, there are included the case where at least one constituent element is modified, added, or omitted and the case where at least one constituent element is extracted and then combined with constituent elements of other embodiments.

DESCRIPTION OF REFERENCE NUMERALS

2: electric rotating machine, 4a, 74a, 75a, 77a: first control circuit board, 4b, 74b, 75b, 77b: second control circuit board, 14: communication line, 14a: first communication line, 14b: second communication line, 16a: first control circuit, 16b: second control circuit, 17a: first rotation sensor, 17a: second rotation sensor, 17c: first-rotation-sensor communication line, 17d: second-rotation-sensor communication line, 36a: first ground, 36b: second ground, 37a: first terminal group, 37b: second terminal group, 40, 60, 70, 71, 72, 73, 76: sensor circuit board, 51, 51a, 51b, 51c, 51d: isolator, 55a: first temperature sensor, 55b: second temperature sensor, 55c: first-temperature-sensor communication line, 55d: second-temperature-sensor communication line, 100, 101: electric rotating machine apparatus, 150: electric power steering apparatus

What is claimed is:

1. An electric rotating machine apparatus comprising:
   an electric rotating machine having a winding of a first system, a winding of a second system, and an output axle;
   one or more sensors for detecting an operating state of the electric rotating machine;
   a first control circuit board on which a first control circuit for controlling a current in the winding of the first system is mounted;
   a second control circuit board that faces the first control circuit board with respect to an axis line of the output axle and on which a second control circuit for controlling a current in the winding of the second system is mounted;
   a communication line connecting the first control circuit with the second control circuit;
   a sensor circuit board that faces an axle end of the output axle and on which the one or more sensors and the communication line are mounted;
   a first terminal group that electrically connects the first control circuit board with the sensor circuit board; and
   a second terminal group that electrically connects the second control circuit board with the sensor circuit board,
   wherein on the sensor circuit board, a ground line is disposed between the communication line and a signal line connected with the sensor.

2. The electric rotating machine apparatus according to claim 1,
   wherein the first control circuit board, the second control circuit board, and the sensor circuit board are arranged in a U-shaped manner,
   wherein the first terminal group connects an electrode at an end portion of the first control circuit board with an electrode at one end of the sensor circuit board, and
   wherein the second terminal group connects an electrode at an end portion of the second control circuit board with an electrode at the other end of the sensor circuit board.

3. The electric rotating machine apparatus according to claim 1, wherein at least one of the sensors is a rotation sensor that detects a rotation angle of the output axle.

4. The electric rotating machine apparatus according to claim 1, wherein at least one of the sensors is a temperature sensor that detects a temperature of the electric rotating machine.

5. The electric rotating machine apparatus according to claim 1, wherein on the sensor circuit board, a plurality of the communication lines are symmetrically arranged with respect to the sensors.

6. An electric power steering apparatus having the electric rotating machine apparatus according to claim 1.

7. An electric rotating machine apparatus comprising:
   an electric rotating machine having a winding of a first system, a winding of a second system, and an output axle;
   one or more sensors for detecting an operating state of the electric rotating machine;
   a first control circuit board on which a first control circuit for controlling a current in the winding of the first system is mounted;
   a second control circuit board that faces the first control circuit board with respect to an axis line of the output axle and on which a second control circuit for controlling a current in the winding of the second system is mounted;

a communication line connecting the first control circuit with the second control circuit;
a sensor circuit board that faces an axle end of the output axle and on which the one or more sensors and the communication line are mounted;
a first terminal group that electrically connects the first control circuit board with the sensor circuit board; and
a second terminal group that electrically connects the second control circuit board with the sensor circuit board,
wherein a signal isolator is mounted on the sensor circuit board.

8. The electric rotating machine apparatus according to claim 7, wherein on the sensor circuit board, a plurality of the signal isolators are mounted at the outside of the sensors.

9. The electric rotating machine apparatus according to claim 8, wherein on the sensor circuit board, a plurality of the signal isolators are symmetrically arranged with respect to the sensors.

10. The electric rotating machine apparatus according to claim 7, wherein the signal isolators are mounted on a side, of the sensor circuit board, that is opposite to a surface thereof on which the sensors are mounted.

11. The electric rotating machine apparatus according to claim 7, wherein the signal isolator connected with the communication line is mounted on the sensor circuit board.

12. An electric rotating machine apparatus comprising:
an electric rotating machine having a winding of a first system, a winding of a second system, and an output axle;
one or more sensors for detecting an operating state of the electric rotating machine;
a first control circuit board on which a first control circuit for controlling a current in the winding of the first system is mounted;
a second control circuit board that faces the first control circuit board with respect to an axis line of the output axle and on which a second control circuit for controlling a current in the winding of the second system is mounted;
a communication line connecting the first control circuit with the second control circuit;
a sensor circuit board that faces an axle end of the output axle and on which the one or more sensors and the communication line are mounted;
a first terminal group that electrically connects the first control circuit board with the sensor circuit board; and
a second terminal group that electrically connects the second control circuit board with the sensor circuit board,
wherein the sensor circuit board is a multi-layer printed wiring board in which a first ground layer connected with a first ground of the first control circuit board and a second ground layer connected with a second ground of the second control circuit board are arranged in such a way as to sandwich an insulating layer therebetween.

* * * * *